United States Patent
Aizpuru et al.

(10) Patent No.: US 7,952,108 B2
(45) Date of Patent: May 31, 2011

(54) REDUCING THERMAL EXPANSION EFFECTS IN SEMICONDUCTOR PACKAGES

(75) Inventors: Jose Joaquin Aizpuru, Murphy, TX (US); Christopher William Johnson, Saschey, TX (US); Bobby Marion Hawkins, Wylie, TX (US)

(73) Assignee: Finisar Corporation, Sunnyvale, CA (US)

( * ) Notice: Subject to any disclaimer, the term of this patent is extended or adjusted under 35 U.S.C. 154(b) by 520 days.

(21) Appl. No.: 11/253,132

(22) Filed: Oct. 18, 2005

(65) Prior Publication Data

US 2007/0087174 A1    Apr. 19, 2007

(51) Int. Cl.
   *H01L 27/15* (2006.01)
(52) U.S. Cl. ..... 257/81; 257/99; 257/100; 257/E33.056; 257/E33.058; 257/E33.059; 313/501; 313/502
(58) Field of Classification Search ..... 257/99, 257/100, 81, 95, 98, E33.058, E33.059, E33.056; 313/501, 502
   See application file for complete search history.

(56) References Cited

U.S. PATENT DOCUMENTS

| | | | | |
|---|---|---|---|---|
| 4,191,943 | A * | 3/1980 | Cairns et al. | 340/815.42 |
| 6,204,523 | B1 * | 3/2001 | Carey et al. | 257/98 |
| 6,592,780 | B2 * | 7/2003 | Hohn et al. | 252/301.36 |
| 7,084,435 | B2 * | 8/2006 | Sugimoto et al. | 257/99 |
| 7,258,816 | B2 * | 8/2007 | Tamaki et al. | 252/301.4 F |
| 7,259,403 | B2 * | 8/2007 | Shimizu et al. | 257/99 |
| 7,501,660 | B2 * | 3/2009 | Schmid et al. | 257/81 |
| 2002/0145152 | A1 | 10/2002 | Shimomura | |
| 2003/0002770 | A1 * | 1/2003 | Chakravorty et al. | 385/14 |
| 2003/0189217 | A1 * | 10/2003 | Imai | 257/99 |
| 2004/0164310 | A1 * | 8/2004 | Uemura | 257/99 |
| 2004/0190304 | A1 | 9/2004 | Sugimoto et al. | |
| 2005/0045897 | A1 * | 3/2005 | Chou et al. | 257/98 |
| 2006/0054901 | A1 * | 3/2006 | Shoji et al. | 257/80 |
| 2006/0102914 | A1 | 5/2006 | Smits et al. | |
| 2006/0124946 | A1 * | 6/2006 | Fujita | 257/98 |

OTHER PUBLICATIONS

Taiwan Intellectual Property Office, First Office Action, Taiwanese Patent Application No. 095134300, dated Dec. 26, 2009.
International Searching Authority, International Application No. PCT/US06/39596, International Search Report and Written Opinion, mailed Jul. 27, 2007.

* cited by examiner

*Primary Examiner* — Kenneth A Parker
*Assistant Examiner* — Jose R Diaz
(74) *Attorney, Agent, or Firm* — Maschoff Gilmore & Israelsen

(57) ABSTRACT

Reducing effects of thermal expansion in electronic components. An electronic device can include a support, such as a leadframe. An electronic component can be supported by the support. A first flexible layer can cover the electronic component. A second more rigid layer can cover the first layer. The first layer can be made from a material that is more flexible than the second layer thereby creating a mechanical buffer layer between the second layer and the electronic component such that the electronic component is protected from thermal expansion of the second portion caused by changes in temperature. The electronic component can be a laser. The first and second materials can be selected to disperse an optical emission from the optical transmitter.

14 Claims, 2 Drawing Sheets

REDUCING THERMAL EXPANSION EFFECTS IN SEMICONDUCTOR PACKAGES

BACKGROUND OF THE INVENTION

1. The Field of the Invention

The present invention relates generally to reducing failures of electronic devices. More specifically, the present invention relates to reducing failure of electronic devices caused by the effects of thermal expansion.

2. The Relevant Technology

Thermal expansion is the tendency of solid objects to increase in length or volume when heated. The amount of expansion typically varies depending on a material's coefficient of thermal expansion (CTE). Different types of materials have defined rates of expansion. For example, plastics typically expand as much as 10 times more than metals, which expand more than ceramics and glass. Different types of materials also have different mechanical properties, such as strength, rigidity, and modulus of elasticity. Different types of materials also have different optical properties, such as translucence and refractivity.

Many electronic devices include plastics. Because plastics expand much more than other materials they can cause stresses on other portions of the device coupled to, or encased within, the plastic. The stresses caused by expansion of the plastic can often cause failure of the electronic device. An electronic device can include silicon based components, metallic leads, thin glass portions, trenches, grooves, or other features that may be particularly prone to cracking. Thus, in these instances, even a slight expansion by adjacent portions of the device can cause failure of the electronic device.

Often, however, plastics are used to protect electronic components within a device. For example, electronic components are often encased within a molded plastic portion to protect the electronic component from its operating environment. In the case of electronic devices for transmitting or receiving optical signals, the molded plastic portion may be at least partially translucent and allow for transmission of light through the molded plastic portion. In addition, lenses, interfaces, and other portions of the device can be created as part of the molded plastic portion.

The molded plastic portion may be designed to provide a level of protection for an electronic component of the device, but the thermal expansion of the molded plastic portion can also cause failure of the electronic component. One way that failure can occur is by cracking of the electrical leads that couple the electronic component to an external electrical source. This is particularly likely where the electrical leads are encased within the molded plastic portion and the electrical leads are subjected to the stresses caused by thermal expansion of the molded plastic portion.

In some instances combinations of materials having different mechanical and/or optical properties have been used to mitigate the undesirable thermal expansion properties. These materials and combination of materials have not, however, prevented damage to the electronic component caused by thermal expansion in many instances. In addition, in many more fragile electronic components, such as those incorporating optical devices, there is an even greater need to improve reliability and reduce damage caused by thermal expansion. Moreover, some electronic devices operate in environments where greater variations in temperature are experienced thereby causing greater changes in expansion of the various materials of the electronic device. Thus, what would be advantageous is to reduce the damaging effects of thermal expansion to components of an electronic device. What would also be advantageous is to reduce the damaging effects of thermal expansion while improving optical transmission characteristics of an optical electronic device.

BRIEF SUMMARY OF THE INVENTION

The present invention relates to reducing failures of electronic devices An electronic device is described. The electronic device can include a support. The electronic device can further include an electronic component supported by the support. The electronic device can further include a first layer covering the electronic component. The electronic device can further include a second layer covering the first layer, wherein the first layer is made from a material that is more flexible than the second layer thereby creating a mechanical buffer layer between the second layer and the electronic component such that the electronic component is protected from thermal expansion of the second portion caused by changes in temperature.

A method for manufacturing an electronic device is described. The method can include coupling an electronic component to a support. The method can further include producing a first layer over the component. The method can further include producing a second layer over the first layer. The first layer is a material that is more flexible than the second layer. The first layer is selected to absorb stresses caused by thermal expansion of the second layer.

A method for manufacturing an optical transmission device is described. The method can include coupling an optical transmitter to a support. The method can further include encasing the optical transmitter with a first material having a first refractive index, the method can further include encasing the first material with a second material having a second refractive index. The second refractive index is greater than the first refractive index so as to disperse a width of an optical emission from the optical transmitter.

These and other aspects of embodiments disclosed herein will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Figure 1:
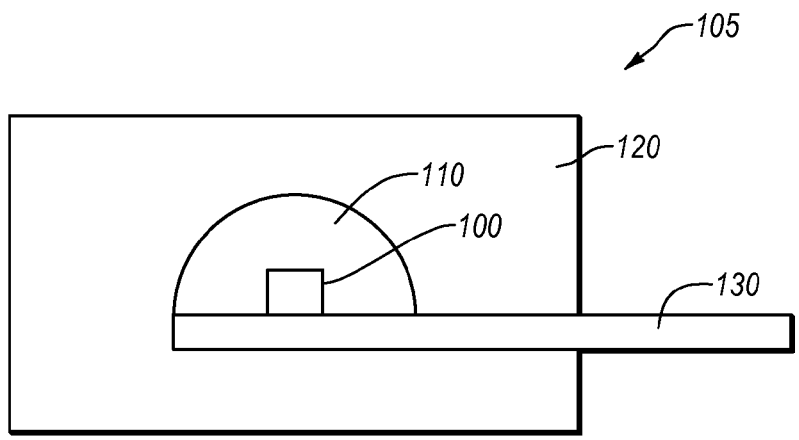
FIG. 1 illustrates an electrical device.

The present invention relates to reducing failure of electronic devices. The principles of the present invention are described with reference to the attached drawings to illustrate the structure and operation of example embodiments used to implement the present invention. Using the diagrams and description in this manner to present the invention should not be construed as limiting its scope. Additional features and advantages of the invention will in part be obvious from the description, including the claims, or may be learned by the practice of the invention. Descriptions of well-known components and processing techniques are omitted so as not to unnecessarily obscure the explanation of the embodiments illustrated herein.

Electronic components must survive dry as well as humid environments in a wide range of temperatures. Packaging electronic devices in plastic provides a cost effective way to protect electronic components from different environments. An aspect of several embodiments relates to reducing failure of electronic devices by reducing stresses on critical components caused by thermal expansion within the device. Stresses caused by thermal expansion can cause failure of electronic devices in many ways. This is especially true for electronic devices that include several different materials having different mechanical properties. For example, many electronic devices have metallic leads and ceramic or glass components, which have different thermal expansion properties than plastic components of the electronic device. As a result, the plastic components will experience a greater expansion then the metallic, glass, or ceramic components resulting in a more than nominal stress applied to the other components and potentially causing failure of the electronic device.

Different materials also have different mechanical properties, such as modulus of elasticity, allowing for the stresses caused by thermal expansion of components of a device to be at least partially absorbed by mechanical deformation. For example, an aspect includes incorporating several different layers of material having different mechanical properties to create a buffer layer in between a fragile component of an electronic device and a more rigid protective layer with a greater CTE. In some instances, the protective layer can incorporate multiple different materials having different thermal expansion coefficients to mitigate the thermal expansion and other mechanical properties of the materials. Moreover several embodiments include several different materials for optical transmission where the different materials have different refractive properties allowing for better optical coupling between an optical transmission device and an optical fiber.

Several embodiments include electronic devices comprising a laser. Accordingly, several embodiments include a buffer layer between the laser and an outer layer. One type of laser is a vertical cavity surface emitting laser (VCSEL). VCSELs are a type of semiconductor laser that produce a laser beam emission perpendicular to the chip surface. VCSELs are characterized by low fabrication cost, low power consumption, on-wafer testability, high coupling efficiency with optical fibers, array producibility, single-mode laser availability, wavelength tenability, lower emission power compared to edge-emitting lasers, and high intrinsic modulation bandwidths.

VCSELs, however, have oxide channels, or cavities, for emission of an optical signal, which can be particularly prone to damage caused by thermal expansion of adjacent portions. In many instances material having undesirable mechanical or optical properties can cause failure or undesirable optical effects on the emission from the oxide channel. For example, a VCSEL may be encased within an overmolded portion at least partially comprised of plastic that may have mechanical properties, such as thermal expansion and/or modulus of elasticity, which can cause the oxide channel to crack resulting in failure of the VCSEL. In addition, a VCSEL encased within an overmolded portion at least partially comprised of glass can have refractive properties that can cause a deflection or undesirable refraction of an optical signal from the VCSEL resulting in failure or poor performance of the VCSEL. Accordingly, several embodiments illustrated herein include a buffer layer between a VCSEL, or other optical electronic device, and an outer layer having less desirable mechanical or optical properties.

Referring to FIG. 1, an electrical device 105 is illustrated according to an example embodiment. The electrical device 105 includes an electrical component 100. The electrical component 100 is located upon a support 130. The electrical component 100 is encased by a first layer 110. The first layer 110 is encased by a second layer 120. The first layer 110 has different mechanical properties than the second layer 120. For example, the first layer 110 is more flexible than the second layer 120 allowing for the first layer 110 to deform and absorb at least a portion of a stress caused by thermal god expansion of the second layer 120 by material deformation of the first layer 110, thereby protecting the electronic component 100 from at least a portion of the stresses that would otherwise be applied to the electronic component 100 by the thermal expansion of the second layer 120.

According to an example embodiment, the electronic device 105 can be an electro-optical device. For example, the electronic component 100 can be a laser, such as a vertical cavity surface emitting laser (VCSEL). VCSELs may be particularly prone to damage caused by thermal expansion of an overmolded portion. For example, VCSELs can have leads that connect the VCSEL to the support 130, such as a leadframe. A leadframe provides electrical connection to the leads of the VCSEL that may also be prone to damage caused by thermal expansion of an overmolded layer.

VCSELs also have cavities, such as oxide cavities, which can allow for emission of an optical signal from the VCSEL. Referring still to FIG. 1, the first layer 110 can have mechanical properties that create a buffer between the second layer 120 and a cavity located on the electronic component 100. For example, the first layer 110 can be more flexible then the second layer 120 allowing for mechanical deformation of the first layer 110 in response to thermal expansion of the second layer 120 thereby protecting a cavity on the electronic component 100, e.g. a VCSEL. Thus, mechanical deformation of the first layer 110 can absorb at least a portion of stresses caused by expansion of the second layer 120 that would otherwise be applied to the electronic component 100. These stresses may otherwise, in some instances, cause a fracture or dislocation of a portion of the electronic component 100, such as an emission cavity or leads of a VCSEL.

According to an example embodiment, the first layer 110 can be made of a plastic material having relatively flexible mechanical properties compared to the second layer 120. For example, the first layer 110 can include silicone. The first layer 110 can also include a combination of silicone materials. One type of silicone based material that can be used to produce the first layer 110 is called Sylgard manufactured by Dow Corning Company. Sylgard is a one-component, ready to use silicone elastomer. The elastomers can be room temperature vulcanizing (RTV) elastomers. Other suitable elastomers having similar mechanical properties can also be used. Preferably the first layer 110 is of a viscous consistency so as to cover the electronic component 100 without running off of the electronic component. In the instance that the first layer is not viscous enough it may run off of the electronic component when the second layer 120 is produced over the first layer 110. In this instance, the first layer may not remain, or may be too thin, to provide the mechanical buffer for the electronic component 100.

According to an example embodiment, the second layer 120 can be made of a plastic material having relatively rigid mechanical properties compared to the first layer 110. For example, the second layer 120 can include a molded plastic created by injection molding, transfer molding, or pour molding. The second layer 120 can include an epoxy material. One type of epoxy material that can be used to produce the second layer 120 is a B-staged epoxy. Epoxy resins are excellent electrical insulation materials and can protect the electrical component 100, such as a VCSEL, from short circuiting, dust, humidity, and other environmental factors that could damage the electrical component 100. The second layer 120, made at least partially of epoxy resins, can be used as an overmolding for the electrical device 105, to protect the electronic component 100, or multiple electronic components 100. The electrical device 105 can include additional components. For example, a ceramic piece can be placed in between the electronic device 100 (e.g. a VCSEL) and the support 130 (e.g. a lead frame).

According to example embodiments, the first layer 110 can include a dye for improving identification of cracks in the electronic component 100 by making cracks more visually discernable. The dye can be transmissive to an optical emission transmitted to, or from, the electronic component 100. The dye can also be not visually apparent unless a blue light, or other means, is used to perceive the dye. The dye can be used to make the locations of cracks or other failure of the electronic component 100, or cracks in the leads electrically coupling the electronic component 100, more visibly discernable.

Figure 2:
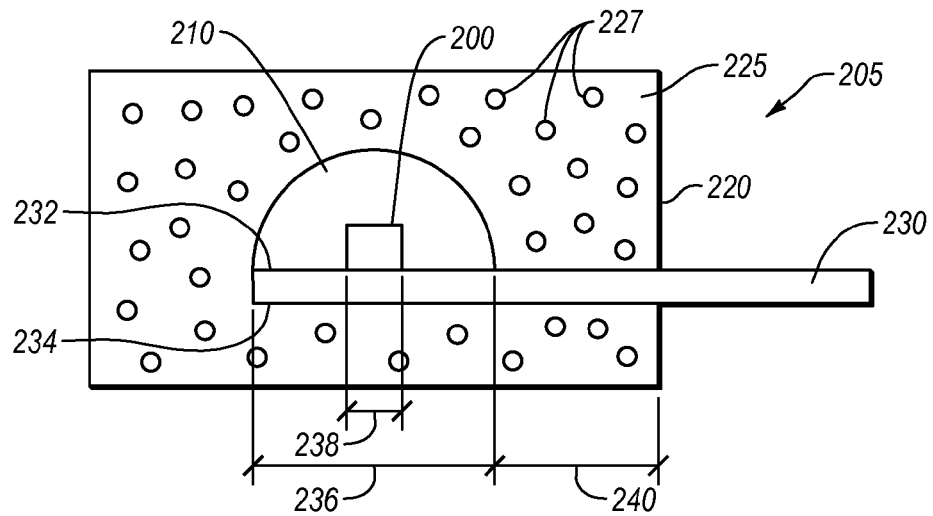
FIG. 2 illustrates an optoelectronic device.

Referring to FIG. 2, an optoelectronic device 205 is shown. An optoelectronic component 200, such as an optical receiver or an optical transmitter, is supported by a leadframe 230. The leadframe 230 defines a top surface 232 and a bottom surface 234. The top surface 232 of the leadframe 230 is directly opposite from and substantially parallel to the bottom surface 234 of the leadframe 230. The optoelectronic component 200 can be coupled to the top surface 232 of the leadframe using a method of die attach, for example. A ceramic plate (not shown) can be located between the optoelectronic component 200 and the top surface 232 of the leadframe 230 where the optoelectronic component 200 is coupled to the ceramic plate, and the ceramic plate is coupled to the top surface 232 of the leadframe 230. A first layer of material 210 can be produced over the optoelectronic component 200. The first layer 210 can be made of a material at least partially composed of silicone, such as Sylgard. As illustrated in FIG. 2, the first layer 210 substantially encases, and is in direct physical contact with, all exposed surfaces of the optoelectronic device 205. Further, as illustrated in FIG. 2, the first layer 210 also covers a portion 236 of the top surface 232 of the leadframe 230.

A second layer 220, which is less flexible then the first layer 210, can be produced over the first layer 210 and at least a portion of the leadframe 230 as illustrated in FIG. 2. For example, as illustrated in FIG. 2, the second layer 220 substantially encases, and is in direct physical contact with, all exposed surfaces of the first layer 210. The second layer 220 also substantially encases, and is in direct physical contact with, all exposed surfaces of the portion 238 of the leadframe 230 that is supporting the optoelectronic device 205. In particular, as illustrated in FIG. 2, the second layer 220 substantially encases, and is in direct physical contact with, the portion 238 of the bottom surface 234 of the leadframe 230 that is directly opposite from the optoelectronic device 205. Further, as illustrated in FIG. 2, the second layer 220 also substantially encases, and is in direct physical contact with, the portion 236 of the bottom surface 234 of the leadframe 230 that is directly opposite from the portion 236 of the top surface 232 of the leadframe 230 that is covered by the first layer 210. Finally, as illustrated in FIG. 2, the second layer 220 also substantially encases, and is in direct physical contact with, a portion 240 of the top and bottom surfaces 232 and 234 of the leadframe 230 that is adjacent to the portion 236 of the leadframe 230. The second layer 220 can be produced by molding the second layer 220 over the first layer 210 and at least a portion of the leadframe 230 using an injection molding, transfer molding, or pour molding process. The second layer 220 can include at least two materials including a first material 225 having different mechanical properties than a second material 227. For example, the second material 227 can have a lower coefficient of thermal expansion than the first material 225. The second material 227 can also have a different modulus of elasticity then the first material 225. According to an example embodiment, the second layer 220 can include a plastic transfer molded material 225 with a glass filler material 227. The glass filler 227 can be glass particles, such as beads or other shapes, which can be embedded in the plastic material 225 prior to, or simultaneous with, formation of the second layer 220 by a transfer molding or pour molding process.

While using a filler material 227 with a lower coefficient of thermal expansion can reduce the overall thermal expansion of the second layer 220, the filler material 227 may have other mechanical or optical effects. For example, using a filler 227 material, such as glass, with a lower coefficient of thermal expansion reduces the overall thermal expansion of the second layer, but as a result, the second layer 220 comprising the two materials 225 and 227 having different thermal expansion properties may also have less elasticity then a second layer without the filler material 227.

In addition, the filler material 227 may have optical effects. For example, where the filler material 227 is glass, or other translucent particles, the filler material 227 may cause scattering of an optical signal transmitted through the second layer 220. This scattering may cause the optoelectronic device 205 to perform differently compared to a non-filled material. For example, where the optoelectronic component 200 comprises an optical receiver, such as a photodiode, filler particles 227 can cause scattering of the optical signal received, and as a result, lower the amount of light that is received by the optical receiver.

Moreover, where the electro-optical component 200 comprises an optical transmitter, glass filler particles can cause scattering of the optical emission and lower the amount of light that is launched into an optically coupled optical fiber. This can be particularly problematic with VCSELs, which have a relatively narrow optical emission characteristic. In fact, the closer the filler particles 227 are to the emission cavity of the VCSEL the more likely that light will be scattered causing the electronic device 205 to function differently or fail.

An advantageous aspect of the embodiment illustrated in FIG. 2 is that the second layer 220 comprising the filler material 227 is located further away from the optoelectronic component 200. Thus, where the optoelectronic component 200 is a VCSEL having an aperture for emitting an optical signal, the filler material 227 is located further away from the emission window of the VCSEL potentially reducing the amount of scattering of the optical signal.

The first layer 210 can be of sufficient thickness so as to provide the mechanical buffer between the optoelectronic component 200 and the second layer 220. The first and second layers 210 and 220 can be at least partially translucent to allow for transmission of an optical signal. The second layer 220 can be of sufficient thickness to provide mechanical support and protection for the optoelectronic component 200 from its operating environment. Using an at least partially transparent filler material 227, such as glass or plastic, will also allow for transmission of optical signals through the second layer 220.

The present invention may be particularly advantageous where the optoelectronic component 200 is operated at relatively high temperatures, such as with VCSELs. VCSELs often operate at a relatively high temperature compared to other optical transmitters, such as light emitting diodes (LEDs). In these instances, the material directly surrounding the optoelectronic component 200 will likewise be subject to the high temperatures, and as a result also be subject to stresses caused by expansion due to the high temperatures.

Figure 3:
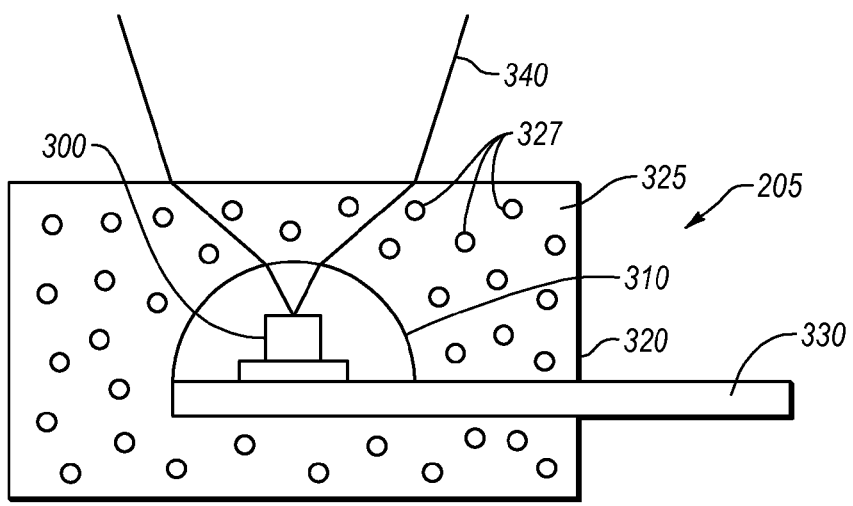
FIG. 3 illustrates an embodiment with multiple layers selected for improved optical performance.

Referring to FIG. 3, an illustration of an embodiment with multiple layers selected for improved optical performance is illustrated. An optical transmitter 300, such as a laser, is supported by and coupled to a leadframe 330. The optical transmitter 300 produces an optical emission 340 that is transmitted through both a first layer 310 and a second layer 320. According to this embodiment, the material of the first layer 310 can be selected for its refractive properties relative to the second layer 320. For example, the optical transmitter 300 may have a transmission of light 340 originally having a particularly narrow angular projection window. The width of the light emission 340 may change as the light propagates further from the optical transmitter 300. It may be desirable to disperse or collimate the light emission 340 as it is transmitted from the optical transmitter 300 to couple the light into a waveguide, such as an optical fiber.

In some instances it may be advantageous to have a wider emission 340 and therefore increase the likelihood of transfer of the light to a fiber. One instance is where a glass filler material 327 has been included in the second layer 320. In this instance, a wider optical emission from the optical transmitter 300, such as a VCSEL, may be particularly advantageous because the light is less likely to encounter scattering effects of the filler material 327. In this instance, selecting a first layer material 310 with a lower index of refraction than the second layer 320 may allow for the light emission 340 width to become larger as illustrated in FIG. 3. This can result in greater optical power and improved optical coupling between the optical transmitter 300 and an optical waveguide. In this manner, the adverse scattering effects of the filler material 327 can be mitigated. This can be particularly advantageous where the optical transmitter 300 is a VCSEL producing a relatively narrow transmission 340.

Figure 4:
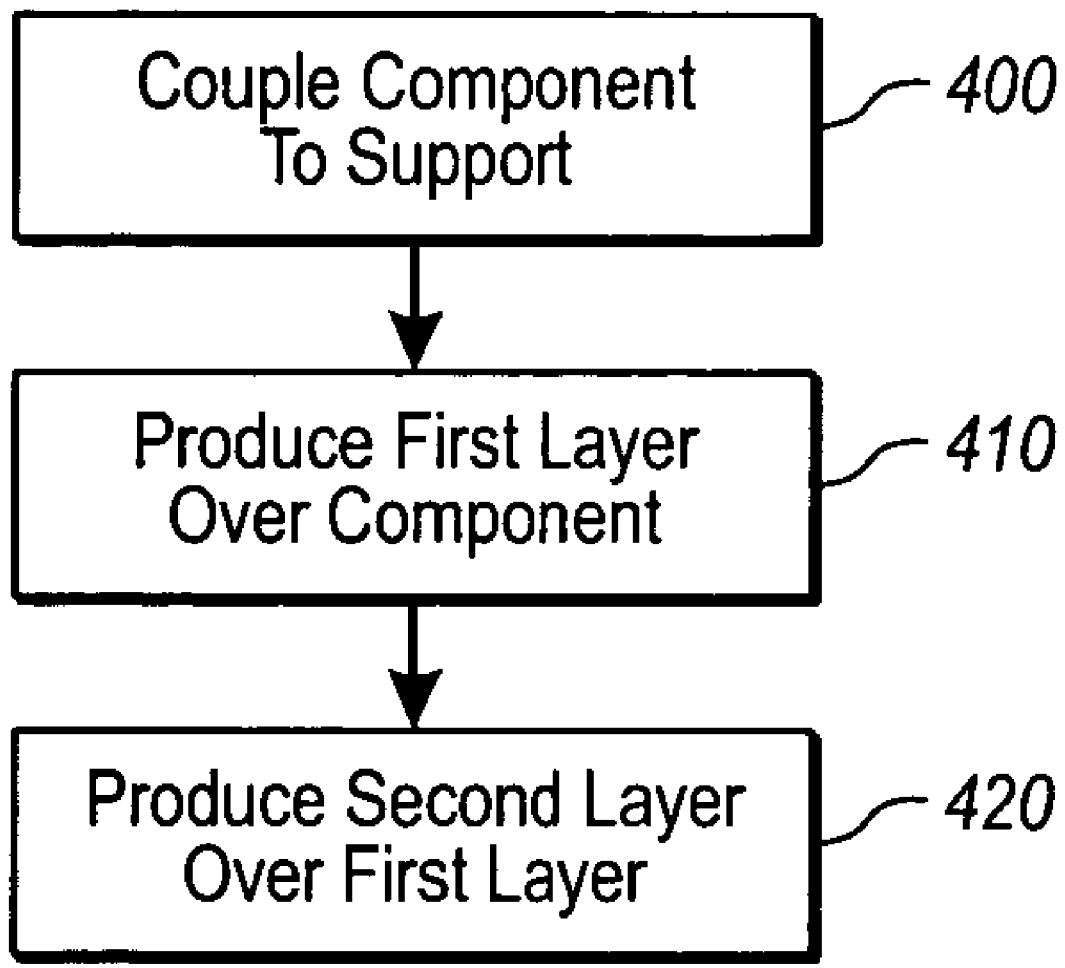
FIG. 4 illustrates a method for manufacturing an electronic device with reduced thermal expansion effects.

Referring to FIG. 4, a method for manufacturing an electronic device with reduced thermal expansion effects is shown according to an example embodiment. An electronic device can be coupled to a support (400). The electronic device can be any electronic device that may be damaged by thermal expansion of an overmolded layer. For example, the electronic device can be an optical transmitter, an optical receiver, an electronic chip, a sensor, or any other electronic device. The present method may be particularly advantageous for manufacturing electronic devices comprising VCSEL transmitters. VCSELs have cavities and electrical leads, which may be particularly prone to damage caused by thermal expansion of a plastic overmolded layer.

The electronic device can be coupled to the support using a method of attachment. For example, the electronic device can be a VCSEL and the support can be a metallic leadframe. The VCSEL can be coupled to the support using a method of die attach. Intermediate pieces can be located between the component and the support. For example, a ceramic piece or die, can be located between the electronic component and the support coupling the VCSEL to the support A first layer can be produced over the electronic device (410). The first layer can be produced by extruding a bead of material that later cures creating a more solid layer over the electronic device. The first layer can have a first modulus of elasticity and a first refractive index. The thickness of the first layer can be chosen to provide sufficient mechanical protection of the electronic component from potentially damaging stresses caused by thermal expansion of a second layer encasing the first layer. For example, the thickness of the first layer can be selected to absorb a stress applied by the second layer due to thermal expansion by physical deformation. The first layer can include a plastic. The plastic can include an elastomer. For example, the plastic can include silicone. For example, the plastic can include Sylgard manufactured by Dow Corning Corporation.

The second layer can be produced over the first layer (420). The second layer can also be produced over at least a portion of the support. The second layer can be produced using a molding process. For example, the molding process can be an injection molding process or a pour/transfer molding process. The second layer can have a second modulus of elasticity and a second thermal expansion coefficient. The second modulus of elasticity can be lower (or greater) than the first modulus of elasticity. The second thermal expansion coefficient can be greater than the first thermal expansion coefficient. The second layer can be substantially more rigid than the first layer providing mechanical support and protection for the electronic device. The second layer can include a filler material, such as glass or plastic, with lower (or greater) thermal expansion characteristics than the rest of the material in the second layer. The filler material can also have a lower modulus of elasticity than the rest of the material in the second layer decreasing the overall modulus of elasticity of the second layer. As a result, the optical component can be protected from the environment by the second layer, while being protected from thermal expansion of the second layer by the first layer. In this manner, the first layer can act as a mechanical buffer between the optical component and the second layer.

The first and second layers can be selected for their relative refractive indexes. The material of the first and second layers can be selected to collimate or disperse an optical signal. The first layer can be selected to have a lower refractive index than the second layer to disperse the optical emission when the optical emission is transmitted from the first layer to the second layer. The first layer can be a silicone based plastic having a refractive index less than an epoxy based second layer. For example, the first layer can be a silicone based plastic having a refractive index of about 1.4 and the second layer can be an epoxy based plastic material having a filler material, such as embedded glass beads, and a refractive index of about 1.55. In this manner, an optical signal transmitted from a laser, such as a VCSEL, through the first layer is dispersed as it enters the second layer and encounters lower scattering effects from the filler material and is received by an optical fiber with more optical power than if the first layer were not produced. Thus, the amount of power of the received signal can be improved by the selection of the first and second layers.

Several tests have been conducted on oxide VCSELs in an open cavity carrier (a chip that is fully exposed to the environment) in both dry and humid environments according to several of the embodiments described above. These experiments have indicated that parts created according to the teachings set forth herein can surpass the reliability of the conventional devices.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An electronic device comprising:
    a support;
    an electronic component supported by the support;
    a first layer substantially encasing, and in direct physical contact with, all exposed surfaces of the electronic component; and
    a second layer substantially encasing, and in direct physical contact with, all exposed surfaces of the first layer, the second layer also substantially encasing, and in direct physical contact with, all exposed surfaces of that portion of the support that is supporting the electronic component,
    wherein the first layer comprises a first material that does not have any filler particles embedded therein and that is more flexible than the second layer thereby creating a mechanical buffer layer between the second layer and the electronic component such that the electronic component is protected from thermal expansion of the second portion caused by changes in temperature, the second layer comprises a second material having filler particles embedded therein, the filler particles have different thermal expansion characteristics than the first material for reducing overall expansion of the second layer in response to increase in temperature, the filler particles have a modulus of elasticity that is different from the first material, and the filler particles cause scattering of an optical signal transmitted through the second layer.

2. An electronic device according to claim 1, further comprising:
    electrical leads electrically coupled to the electronic component and at least partially encased by the first layer to create a mechanical buffer between the electrical leads such that the electrical leads are protected from thermal expansion of the second layer caused by changes in temperature; and
    a ceramic piece mounted between the support and the electronic component.

3. An electronic device according to claim 1, the electronic component further comprising:
    an oxide channel for producing an optical emission.

4. An electronic device according to claim 1, wherein the support is a leadframe or a substrate, and wherein the electronic component is one of: an optical receiver, an optical transmitter, a laser, a vertical cavity surface emitting laser (VCSEL), a sensor, a capacitor, a photodiode, or a silicon chip.

5. An electronic device according to claim 4, wherein:
    the electronic component is a VCSEL and the support is a leadframe;
    the VCSEL is die attached to a top surface of the leadframe that is directly opposite from and substantially parallel to a bottom surface of the leadframe; and
    the second layer substantially encases, and is in direct physical contact with, the portion of the bottom surface of the leadframe that is directly opposite from the VCSEL.

6. An electronic device according to claim 5, wherein the second layer substantially encases, and is in direct physical contact with, all of the bottom surface of the leadframe that is directly opposite from a portion of the top surface of the leadframe that is covered by the first layer.

7. An electronic device according to claim 1, wherein the first material comprises silicone.

8. An electronic device according to claim 1, wherein the first material comprises an elastomer material and the second material comprises a plastic material.

9. An electronic device according to claim 1, wherein the filler material is glass and the rest of the second layer is a B-staged epoxy.

10. An electronic device according to claim 1, wherein the first layer comprises a dye for visually accentuating cracks in the electronic device, wherein the dye is at least partially translucent allowing for optical communication of optical signals through the first layer with the electronic component.

11. An electronic device according to claim 10, wherein the first layer has a refractive index of about 1.4 and the second layer has a refractive index of about 1.55.

12. An electronic device according to claim 1, wherein the electronic component is an optical transmitter, the first layer and second layer are at least partially transparent allowing for transmission of an optical emission from the optical transmitter through the first and second layers, and wherein the first layer has a lower index of refraction than the second layer.

13. An electronic device according to claim 1, wherein the second material comprises plastic so as to protect the electronic component from different environments including both dry and humid environments.

14. An electronic device according to claim 1, wherein the second layer is produced by an injection molding process, a transfer molding process, or a pour molding process.

* * * * *